United States Patent
Kinoshita et al.

(10) Patent No.: US 7,038,268 B2
(45) Date of Patent: May 2, 2006

(54) NONVOLATILE SEMICONDUCTOR MEMORY DEVICE

(75) Inventors: Shigeru Kinoshita, Yokohama (JP); Hiroaki Hazama, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/748,134

(22) Filed: Dec. 31, 2003

(65) Prior Publication Data
US 2004/0150033 A1     Aug. 5, 2004

(30) Foreign Application Priority Data
Jan. 7, 2003 (JP) .............................. 2003-001488

(51) Int. Cl.
*H01L 29/788* (2006.01)

(52) U.S. Cl. .................. 257/317; 257/315; 257/316; 257/321; 257/324

(58) Field of Classification Search ................ 257/239, 257/261, 295, 298, 314–326
See application file for complete search history.

(56) References Cited

U.S. PATENT DOCUMENTS

| | | | | |
|---|---|---|---|---|
| 5,973,353 | A | * 10/1999 | Yang et al. | ................. 257/315 |
| 6,153,469 | A | * 11/2000 | Yun et al. | ................... 438/257 |
| 6,483,146 | B1 | * 11/2002 | Lee et al. | ................... 257/317 |
| 6,573,139 | B1 | * 6/2003 | Lee et al. | ................... 438/257 |

FOREIGN PATENT DOCUMENTS

JP      2001-160618     6/2001

\* cited by examiner

*Primary Examiner*—Andy Huynh
(74) *Attorney, Agent, or Firm*—Oblon, Spivak, McClelland, Maier & Neustadt, P.C.

(57) ABSTRACT

In a nonvolatile semiconductor storage device which is electrically writable and erasable, a silicon substrate, a plurality of element isolation portions which project from the silicon substrate and are disposed at a predetermined interval, floating electrodes disposed between the isolation portions, and a control electrode laminated on the isolation portions and the floating electrodes are provided, and an interval between the adjacent floating electrodes is formed greater at the side away from the silicon substrate than at the silicon substrate side.

8 Claims, 5 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2003-001488, filed Jan. 7, 2003, the entire contents of which are incorporated herein by reference.

BACKGROUND OF THE INVENTION

1. Field of the Invention

The present invention relates to a nonvolatile semiconductor storage device and a manufacturing method thereof, and in particular, to a nonvolatile semiconductor storage device and a manufacturing method thereof which can reduce a capacity between floating electrodes and which can improve reliability of the device.

2. Description of the Related Art

Conventionally, a nonvolatile semiconductor storage device is used for a storage LSI or the like. FIG. 5 and FIG. 6 are cross-sectional views showing a manufacturing process of a nonvolatile semiconductor storage device. An element isolation forming process and a floating electrode forming process are included in the manufacturing process of the nonvolatile semiconductor storage device.

FIGS. 5A and 5B are cross-sectional views showing the element isolation forming process for forming element isolation portions. First, a first silicon oxide film 2, a first polycrystalline silicon film 3, a silicon nitride film 4, and a second silicon oxide film 5 are formed on the silicon substrate 1. Further, photo resist (unillustrated) is processed so as to be a desired pattern by photolithography, and the silicon nitride film 4 and the second silicon oxide film 5 are etched by an RIE (Reactive ion etching) method by using the photo resist as a mask.

Next, the silicon substrate 1 is exposed in $O_2$ plasma, and the photo resist is eliminated. Further, the polycrystalline silicon film 3, the first silicon oxide film 2, and the silicon substrate 1 are etching-processed by using the second silicon oxide film 5 as a mask, and as shown in FIG. 5A, trenches 1a are formed in the silicon substrate 1.

Next, a third silicon oxide film 6 of several nm is formed by being heated in an $O_2$ atmosphere, and thereafter, fourth silicon oxide films 7 are filled by an HDP (high density plasma)—CVD (chemical vapor deposition) method in the grooves 1a in the silicon substrate 1. Further, the fourth silicon oxide films 7 are flattened by a CMP (chemical mechanical polish) method and are heated in a nitrogen atmosphere. Next, after the device is immersed in an $NHF_4$ solution, the fourth silicon nitride film 4 is removed by phosphoric acid to 150° C. as shown in FIG. 5B. The element isolation process for forming STI (isolation) is described up to the above description.

Next, the floating electrode forming process is carried out. As shown in FIG. 6A, the second polycrystalline silicon film 8 to which phosphorus are added and the fifth silicon oxide film 9 are formed by a low pressure CVD method, and photo resist R is processed so as to be a desired pattern by photolithography. The fifth silicon oxide film 9 is etching-processed by the RIE method by using the photo resist R as a mask material. Further, the silicon substrate 1 is exposed in $O_2$ plasma, and the photo resist R is eliminated.

Next, as shown in FIG. 6B, the sixth silicon oxide film 10 is formed by the low pressure CVD method. The fifth silicon oxide film 9 and the six silicon oxide film 10 are etching-processed by using the sixth silicon oxide film 10 as a mask material. Next, by using the fifth silicon oxide film 9 and the six silicon oxide film 10 as mask materials, as shown in FIG. 6C, the second polycrystalline silicon 8 is etched by the RIE method.

Next, the silicon substrate 1, is immersed in a weak $NHF_4$ solution in order to remove the fifth silicon oxide film 9 and the sixth silicon oxide film 10, an ONO film ($SiO_2$—SiN, —$SiO_2$ film) 11 is formed by the low pressure CVD method, and heat treatment is applied to the device in an oxide atmosphere. Next, as shown in FIG. 6D, a third polycrystalline silicon film 12 which will be an insulating layer is formed by the low pressure CVD method.

Note that, with respect to the cross-section of a memory cell array, there are memory cell arrays in which the width between adjacent floating electrodes is greater at the side away from the substrate than at the substrate side. However, there is no particular explanation as to the reason why such a structure/configuration is used.

In the method for manufacturing the above-described nonvolatile semiconductor storage device, there has been the following problem. Namely, in the floating electrode forming process, the process of isolating the floating electrode must be carried out on the element isolating region. Therefore, the width of floating electrode trench is limited by the width of the element isolating region and the alignment offset amount of the PEP (Photo Etching Process), and the interval between the floating electrodes cannot be made sufficiently wide. If the interval between the floating electrodes is narrow, fluctuations in the threshold voltage arise due to the capacitive coupling between the floating electrodes, which significantly affects the reliability of the device.

FIG. 7 through FIG. 9 are explanatory diagrams showing the principles of fluctuations in threshold voltage. Namely, as shown in FIGS. 7A through 7C, the nonvolatile semiconductor storage device carries out storage by injecting electric charge into a floating electrode FG by FN tunnel current. At this time, in the case of 1-bit cell NAND flash memory, as shown in FIG. 7B, because the electric charge corresponds to "0" or "1", Vths are apart from each other. On the other hand, for example, in the case of a multilevel cell NAND flash memory, as shown in FIG. 7C, because the electric charges are "01", "00", "10", and "11", and Vths are close to one another.

Therefore, as shown in FIGS. 8A and 8B, writings are successively carried out into the floating electrodes, and in the case of maintaining electric charge, when a capacity between the floating electrodes becomes large between the floating electrodes adjacent to one another, there may be a case where fluctuations in electric potential arise by being affected by electric charge of the adjacent floating electrode.

As shown in FIG. 8C, when the capacity between the floating electrodes becomes large, this is a cause of a threshold voltage distribution M1 denoting "10", for example, to shift to the threshold voltage distribution M2, and of the interval with an adjacent threshold voltage distribution denoting "00" to be narrowed from m1 to m2, and of the reliability of the device deteriorating.

FIG. 9 is an explanatory diagram showing an electric potential shift $\Delta V_{fg}$ accompanying interference between the floating electrodes. Namely, the capacity between the floating electrodes is calculated on the basis of formula (1) by the adjacent capacities between the floating electrodes $C_{fgx}$, $C_{fgxy}$, $C_{fgy}$, and the capacities with the respective members $C_{tun}$, $C_{ono}$.

Namely, $$\Delta V_{fg} = \{(\Delta V1 + \Delta V2)C_{fgx} + \Delta V4 C_{fgy} + (\Delta V3 + \Delta V5)C_{fgxy}\} / (C_{tun} + C_{ono} + 2C_{fgx} + 2C_{fgy} + 4C_{fgxy})$$

(1)

BRIEF SUMMARY OF THE INVENTION

Then, an object of the present invention is to suppress fluctuations in threshold voltage due to a capacitive coupling due to a capacity between floating electrodes being reduced, and to improve reliability of a device.

According to one aspect of the present invention, there is provided a nonvolatile semiconductor storage device, which is electrically writable and erasable, comprising: a substrate; a plurality of isolation portions which project from the substrate and are disposed at a predetermined interval; floating electrodes arranged between the isolation portions; and an insulating layer laminated on the isolation portions and the floating electrodes, wherein an interval between the adjacent floating electrodes is formed greater at the side away from the substrate than at the substrate side.

According to another aspect of the present invention, there is provided method for manufacturing a nonvolatile semiconductor storage device, comprising: an element isolation portion forming step of forming element isolation portions which project from a substrate on the substrate; a polycrystalline silicon layer forming step of forming a polycrystalline silicon layer on the substrate and the element isolation portions; a first mask material forming process of forming a first mask material on the polycrystalline silicon layer; a first etching process of etching the polycrystalline silicon layer up to a depth at least greater than or equal to ⅓ of a thickness of the polycrystalline silicon layer, in a region of the top surface of the element isolation portion; a second mask material forming process of forming a second mask material on the polycrystalline silicon layer; a second etching process of etching the polycrystalline silicon layer up to the element isolation portion, in a region etched by the first etching process; and an insulating layer forming process of forming an insulating layer on the element isolation portions and the polycrystalline silicon layer.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
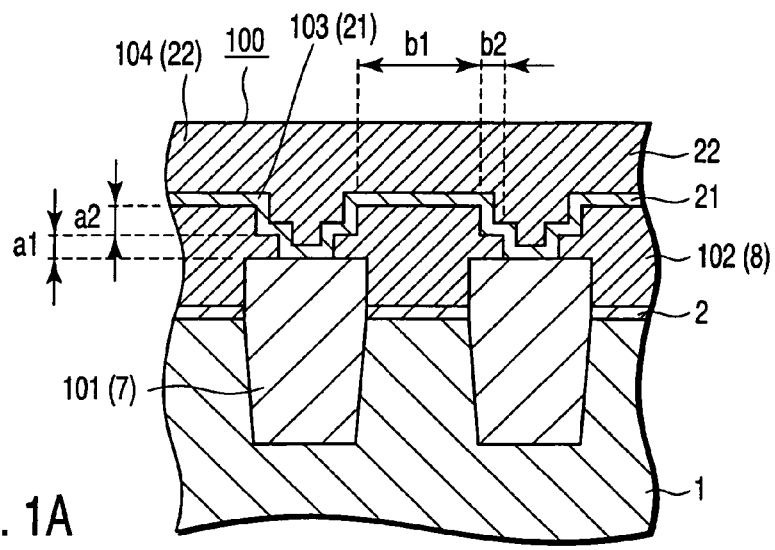
FIG. 1A is a cross-sectional view showing a nonvolatile semiconductor storage device relating to a first embodiment of the present invention.
Figure 1B:
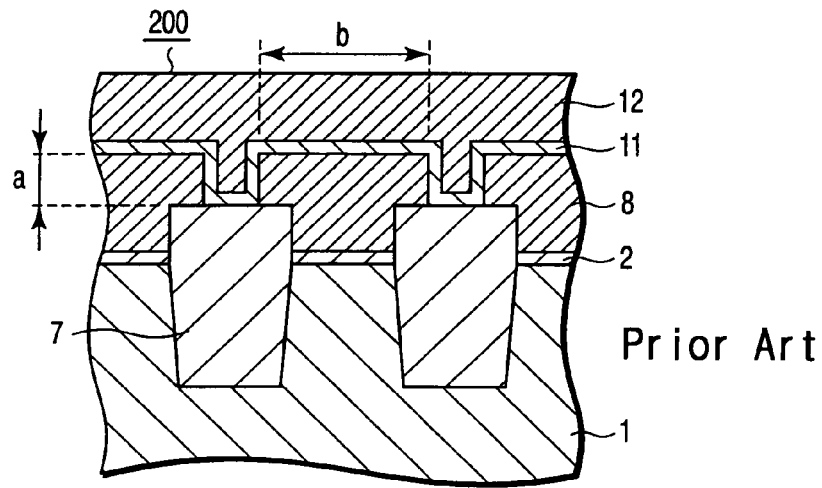
FIG. 1B is a cross-sectional view showing a nonvolatile semiconductor storage device relating to a comparative example.

FIG. 1A is a cross-sectional view showing a nonvolatile semiconductor storage device 100 relating to a first embodiment of the present invention, and FIG. 1B is a cross-sectional view showing a general nonvolatile semiconductor storage device.

The nonvolatile semiconductor storage device 100 has a silicon substrate 1, a first silicon oxide film 2 formed on the silicon substrate 1, element isolation portions 101 provided so as to be projected at a predetermined interval at the silicon substrate 1, floating electrodes 102 provided between these element isolation portions 101, a boundary layer 103 provided on the element isolation portions 101 and the floating electrode 102, and a control electrode 104 laminated on the boundary layer 103.

Note that the element isolation portion 101 is formed from a fourth silicon oxide film 7, and the floating electrode 102 is formed from a first polycrystalline silicon 3 and a second polycrystalline silicon 8, and the boundary layer 103 is formed from an ONO film 21, and the control electrode 104 is formed from a third polycrystalline silicon film 22.

The boundary layer 103 is formed in the shape of two steps on the element isolation portions 101, and the length in the transverse direction which is perpendicular to the thickness direction thereof is formed so as to be short at the silicon substrate 1 side, and is formed so as to be long at the side away from the silicon substrate 1. Note that the dimensions of the respective portions of the boundary layer 103 are formed as shown in FIG. 1A. Accordingly, an outer circumferential length L of the floating electrode 102 contacting the boundary layer 103 is expressed by $$L = 2(a1 + a2) + (b1 + 2b2) \tag{2},$$

and substantially corresponds to the sum of a length a in the depth direction and a length b in the transverse direction in FIG. 1B.

Figure 5A:
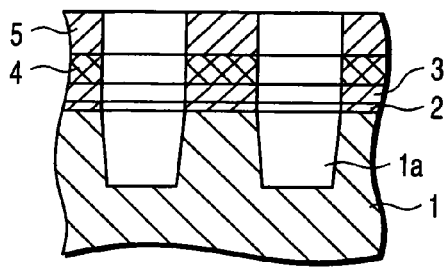
FIGS. 5A and 5B are cross-sectional views showing a manufacturing process (an element isolation forming process) of a general nonvolatile semiconductor storage device.
Figure 5B:
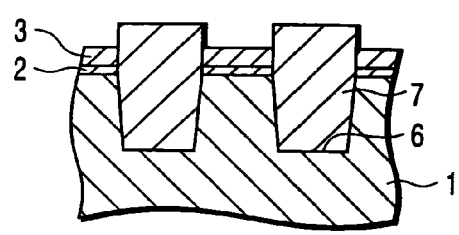
Figure 6A:
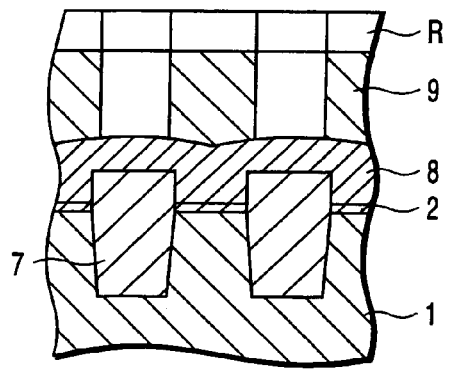
FIGS. 6A through 6D are cross-sectional views showing a manufacturing process (floating electrode forming process) of a conventional nonvolatile semiconductor storage device.
Figure 6B:
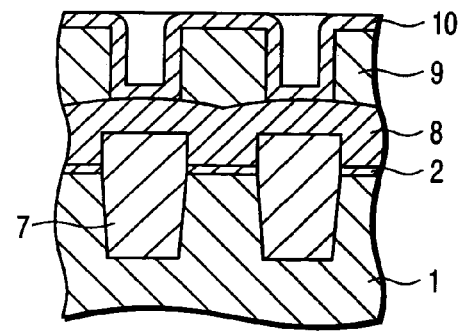
Figure 6C:
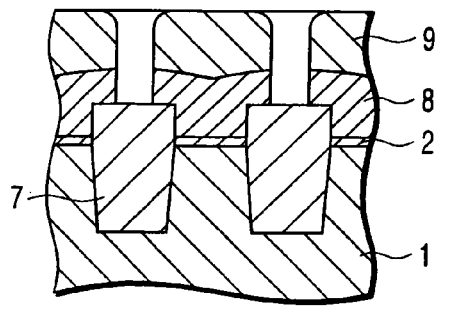
Figure 6D:
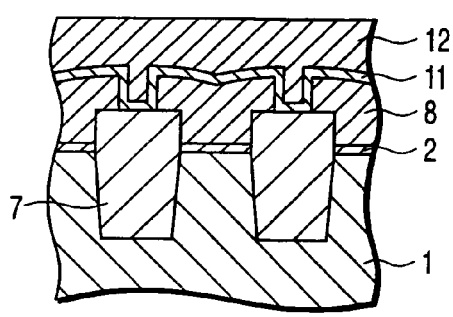
Figure 7A:
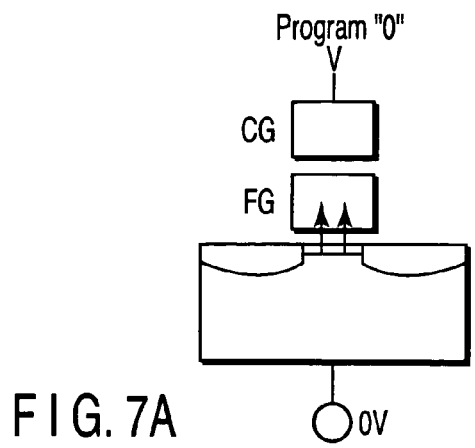
FIGS. 7A through 7C are explanatory diagrams showing the principles of an electric potential shift between the floating electrodes.
Figure 7B:
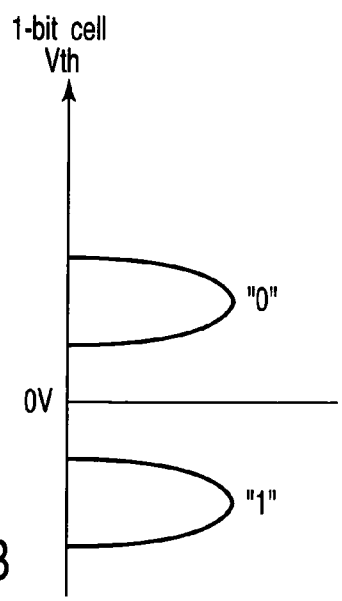
Figure 7C:
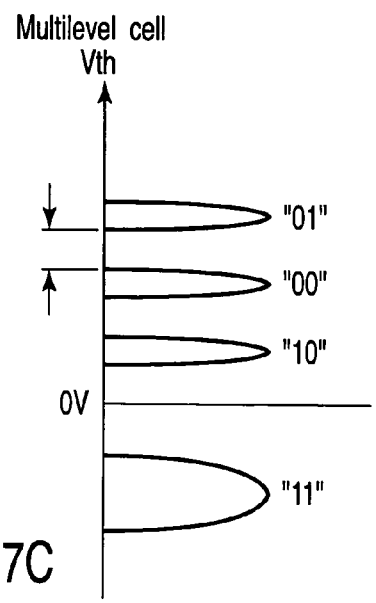
Figure 9:
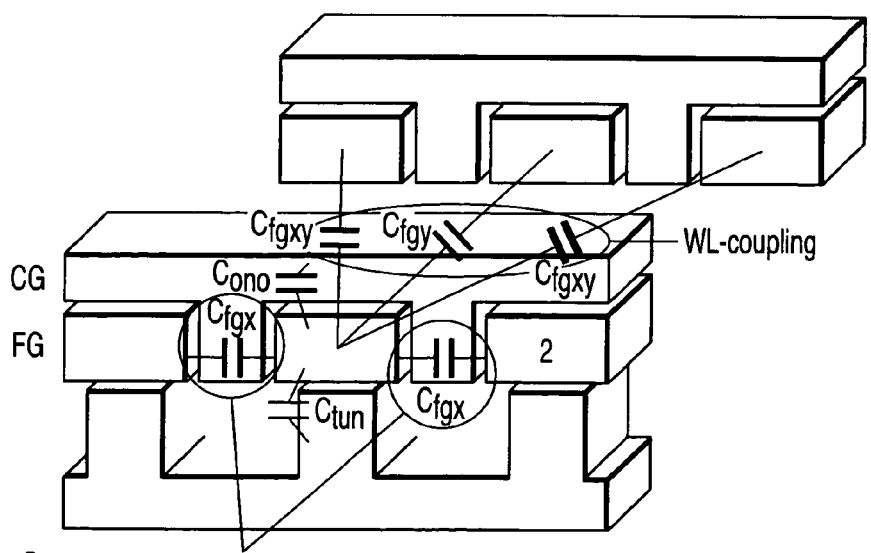
FIG. 9 is an explanatory diagram showing the principles of an electric potential shift between the floating electrodes.
Figure 8A:
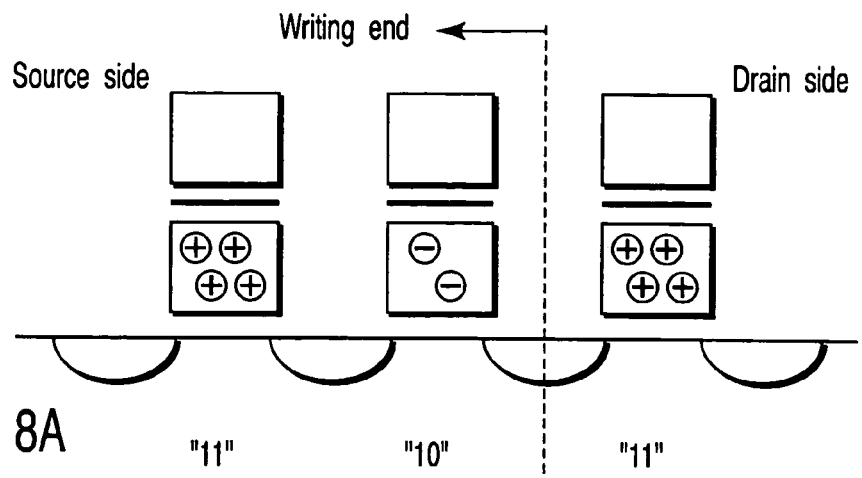
FIGS. 8A through 8C are explanatory diagrams showing the principles of an electric potential shift between the floating electrodes.
Figure 8B:
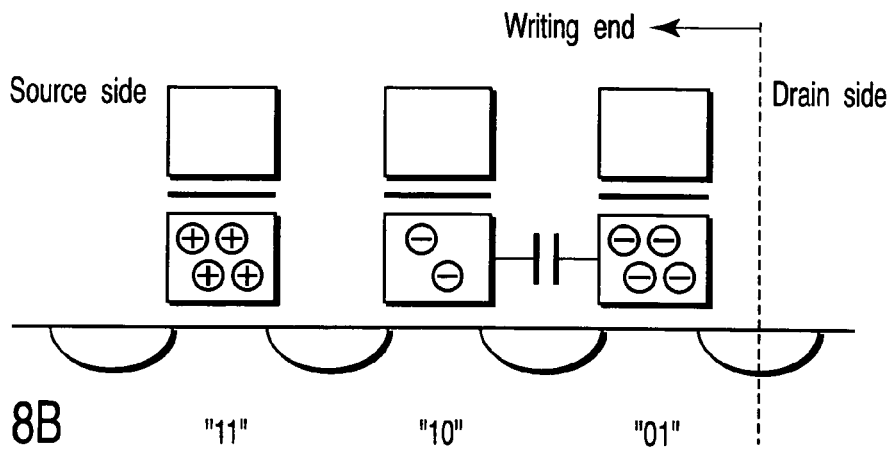
Figure 8C:
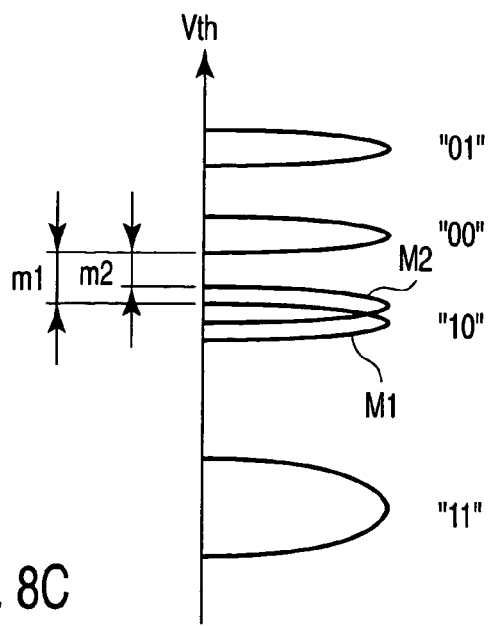

The nonvolatile semiconductor storage device 100 is manufactured by a floating electrode forming process shown in FIGS. 2A through 2E. Note that, because the element isolation forming process which is preprocessing of the floating electrode forming process is the same as that shown in FIG. 5, description thereof will be omitted.

Figure 2A:
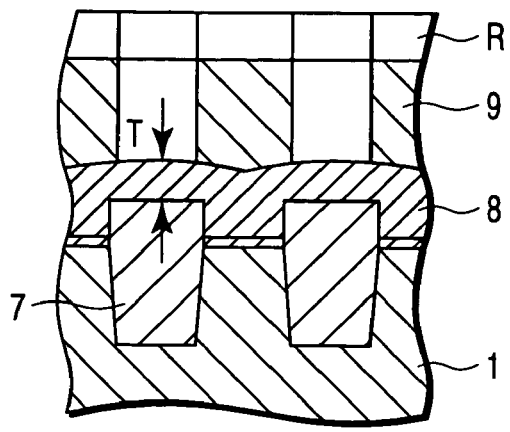
FIGS. 2A through 2E are cross-sectional views showing a manufacturing process (floating electrode forming process) of the nonvolatile semiconductor storage device.

As shown in FIG. 2A, by the low pressure CVD method, the second polycrystalline silicon film 8 to which phosphorus is added is formed up to the extent where the thickness thereof becomes T, and a fifth silicon oxide film 9 is formed so as to be a predetermined thickness, and photo resist R is processed to be a desired pattern by photolithography. The fifth silicon oxide film 9 is etching-processed by the RIE method by using the photo resist R as a mask material.

Figure 2B:
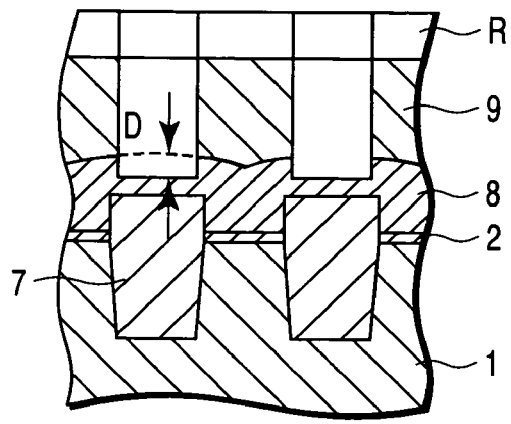

Moreover, as shown in FIG. 2B, the second polycrystalline silicon 8 is dug by the RIE method so as to have a dug depth D, and the etching process by the RIE method is stopped before the second polycrystalline silicon 8 is completely dug through. The dug depth D of the second polycrystalline silicon 8 at this time is made to be greater than or equal to ⅓ of a thickness T of the polycrystalline silicon 8 before being processed. The reason for this will be described later.

Figure 2C:
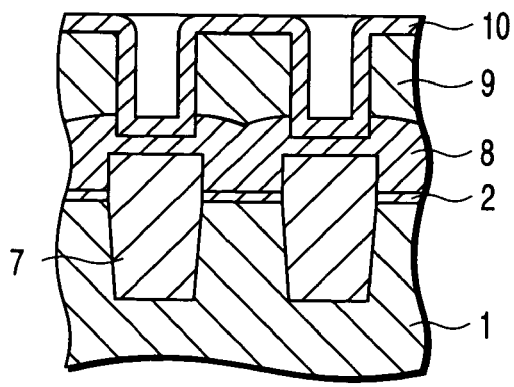
Figure 2D:
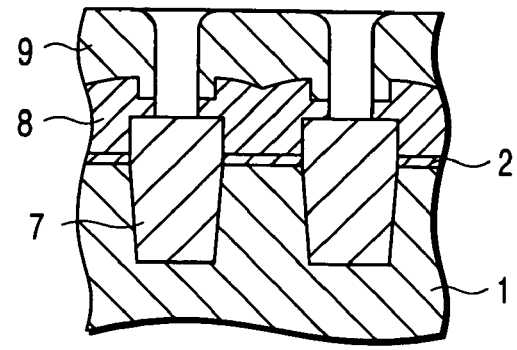

Next, the silicon substrate 1 is exposed in $O_2$ plasma, and the photo resist R is removed. Further, as shown in FIG. 2C, a sixth silicon oxide film 10 is formed by the low pressure CVD method. The fifth silicon oxide film 9 and the sixth silicon oxide film 10 are etching-processed by using the sixth silicon oxide film 10 as a mask material. Next, by using the fifth silicon oxide film 9 and the sixth silicon oxide film 10 as mask materials, as shown in FIG. 2D, the second polycrystalline silicon 8 is etched by the RIE method. At this time, the portions of the second polycrystalline silicon 8 which were previously left and not dug completely through are processed. The opening widths of the masks at this time are narrower than that at the time of engraving the second polycrystalline silicon halfway, and the processed shape of the second polycrystalline silicon 8 becomes a step shape.

Figure 2E:
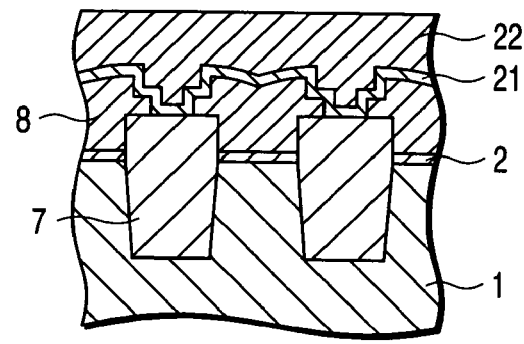

Next, the fifth silicon oxide film 9 and the sixth silicon oxide film 10 are peeled off by a hydrofluoric acid etchant. Next, after the device is immersed in a weak $NHF_4$ solution, the ONO film 21 is formed by the low pressure CVD method and heat treatment is applied to the device in an oxide atmosphere. Next, as shown in FIG. 2E, a third polycrystalline silicon film 22 is formed by the low pressure CVD method.

The nonvolatile semiconductor storage device 100 has the following effects. Namely, the boundary layer 103 which is the boundary between the floating electrodes 102 and the control electrode 104 is formed in the step shape, and the interval between the floating electrodes 102 is greater at the upper portion of the floating electrode 102 (the side away from the silicon substrate 1) than at the lower portion of the floating electrode 102 (the silicon substrate 1 side).

Therefore, an electrostatic capacity between the floating electrodes 102 can be reduced, and aligning positions of the boundary layer 103 with respect to the element isolation portions 101 can be positioned at an accuracy which is the same as in the conventional art. Further, due to the cross-sectional surface area of the floating electrode 102 being made small, an electrostatic capacity with the floating electrode 102 facing one another can be reduced as well.

On the other hand, the outer circumferential length L of the floating electrode 102 which is a factor determining a capacity between the control electrode and the floating electrode substantially corresponds to the sum of the length a in the depth direction and the length b in the transverse direction in FIG. 1B. Namely, because the outer circumferential length L can be sufficiently ensured due to the boundary layer 103 being formed in the step shape, the capacity between the control electrode and the floating electrode is not reduced, and only the capacity between the floating electrodes can be reduced. Note that, when the capacity between the control electrode and the floating electrode is reduced, it is necessary to make a writing voltage of the control electrode 104 high. Making the writing voltage high causes leak current at PN Junction.

Two boundary layers 103 are used. Instead, three or more boundary layers may be used. The floating electrode has a stepped portion. Nonetheless, it may be tapered only if its total peripheral length is at least 90% of (2a+b). The total peripheral length of the electrode must be 90% or more of (2a+b). If it is of this value, the reduction in the capacitance between the control electrode and the floating electrode will be less than 10%, which is less than the 10% change that my result from process variation.

Figure 3:
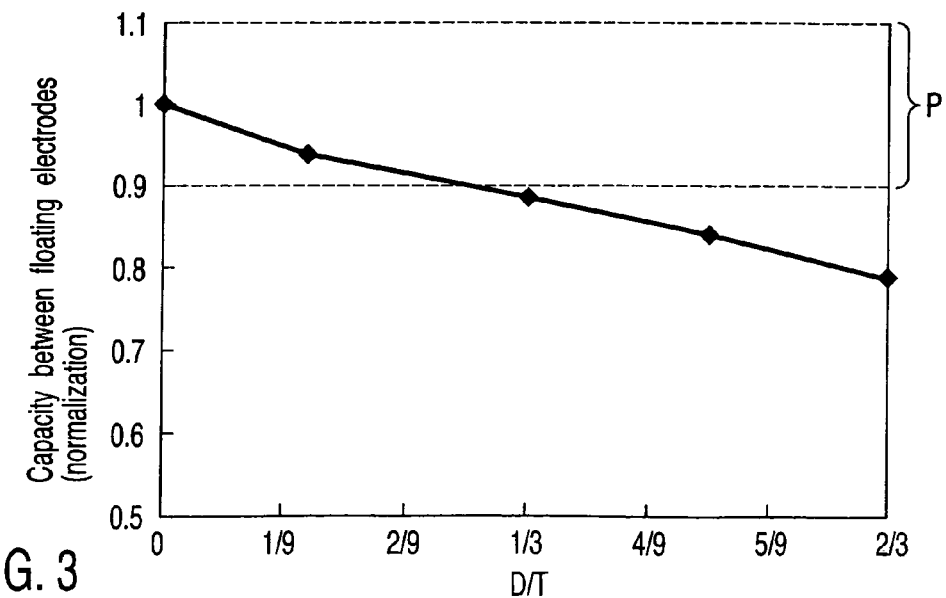
FIG. 3 is an explanatory diagram showing the relationship between a ratio of a dug depth D of a second polycrystalline silicon with respect to a thickness T of the polycrystalline silicon before being processed and a capacity between the floating electrodes in the nonvolatile semiconductor storage device.

Next, the reason that the dug depth D of the second polycrystalline silicon 8 is made to be greater than or equal to ⅓ of the thickness T of the polycrystalline silicon 8 before being processed will be described. FIG. 3 is a graph in which the relationship between D/T and the capacity between the control electrode and the floating electrode is simulated. Here, the capacity between the floating electrodes when D/T is 0 is normalized to 1. As can be understood from FIG. 3, when the first digging of the polycrystalline silicon is carried out such that D/T is ⅓ or more, the capacity between the floating electrodes is reduced by 10.5% as compared with the time when D/T is 0.

The capacity between the floating electrodes has dispersion of about ±10% (the range of P in FIG. 3) in accordance with a film thickness of the polycrystalline silicon or dispersion in process of processing of etching or the like. Even if the polycrystalline silicon is a step-processed shape, when D/T is less than or equal to ⅓, because a reduction effect of the capacity between the floating electrodes is less than or equal to 10%, and is smaller than the amount of capacity dispersion, improvement in device characteristics (reduction in threshold voltage fluctuations) cannot be expected. Accordingly, in order to obtain a capacity reducing effect greater than the range of the capacity dispersion, ⅓ or more is required as D/T.

As described above, in accordance with the nonvolatile semiconductor storage device 100 relating to the first embodiment of the present invention, due to the interval between the floating electrodes at the lower portions of the floating electrodes 102 being made narrow, and the interval at the upper portions of the floating electrodes 102 being made broad, a positioning accuracy of the boundary layer 103 can be made the same as in the conventional art, and an electrostatic capacity between the floating electrodes 102 adjacent to one another can be reduced, and fluctuations in the threshold voltage due to the capacitive coupling between the floating electrodes 102 can be made small. Further, because the cross-sectional surface area of the floating electrode 102 can be made small, the electrostatic capacity between the floating electrodes 102 facing one another can be reduced, and fluctuations in the threshold voltage due to the capacitive coupling between the floating electrodes 102 can be made small.

Moreover, while suppressing deterioration in withstand pressure of the joining by reduction in the capacity between the control electrode and the floating electrode, a fluctuation in a threshold value due to the capacitive coupling between the floating electrodes 102 can be made small.

Figure 4A:
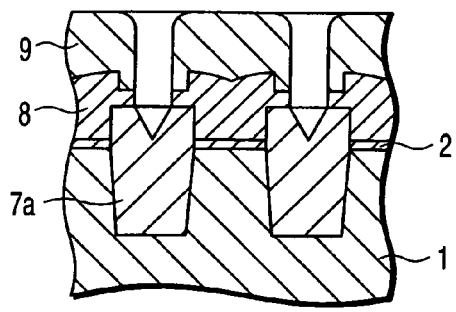
FIGS. 4A and 4B are cross-sectional views showing a nonvolatile semiconductor storage device relating to a second embodiment of the present invention.
Figure 4B:
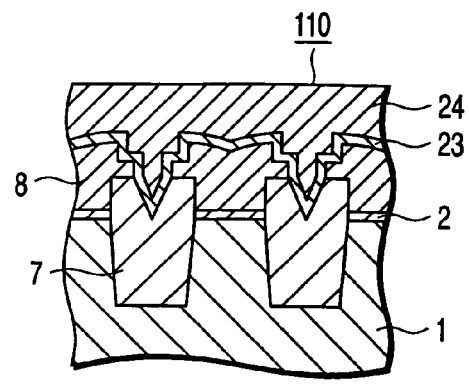

FIGS. 4A and 4B are diagrams showing some portions of a manufacturing process of a nonvolatile semiconductor storage device relating to a second embodiment of the present invention. Note that, because the manufacturing processes are the same processes as those up to FIG. 2D in the first embodiment, detailed description thereof will be omitted.

As shown in FIG. 4A, fourth silicon oxide films 7 are dug so as to be a cross-sectional V shape by using the silicon oxide films 8 and 9 as mask materials, and concave portions 7a are formed. Here, the cross-sectional V-shape means that the cross-sectional surface area in the transverse direction becomes narrower from the opening portion to the bottom portion of the concave portion 7a, and the bottom portion may have a flat trapezoidal cross-sectional shape.

Next, the fifth silicon oxide film 8 and the sixth silicon oxide film 9 are peeled off by a hydrofluoric acid etchant. Next, after the device is immersed in a weak $NHF_4$ solution, and the ONO ($SiO_2$, SiN, $SiO_2$) film 23 is formed by the low pressure CVD method and heat treatment is applied to the device in an oxide atmosphere. Next, as shown in FIG. 4B, a third polycrystalline silicon film 24 is formed by the low pressure CVD method.

In accordance with the nonvolatile semiconductor storage device 110 structured in this way, an electrical short circuit between the control electrode 104 embedded in the concave portion 7a and the silicon substrate 1 can be suppressed. In this case, the capacity between the floating electrodes can be reduced over the case in which the concave portion 7a is not formed by 35%. This is because, due to the third polycrystalline silicon film 24 being embedded so as to hold the ONO film 23 into the concave portions 7a, a wraparound capacity from the lower portion between the floating electrodes can be reduced.

Note that the present invention is not limited to the above-described embodiments, and it goes without saying that various modifications are possible within a range which does not deviate from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   a plurality of element isolation portions which are disposed at a predetermined interval on a surface portion of the semiconductor substrate;
   floating electrodes arranged on the semiconductor substrate with a first insulating film interposed in between the element isolation portions;
   an insulating film formed on the element isolation portions and the floating electrodes; and
   a control electrode formed on the second insulating film;
   wherein the adjacent floating electrodes have a plurality of step portions at opposite sides, a tapered concave portion extending from the step portions is arranged in a depth direction of the semiconductor substrate between the floating electrodes, and an interval between the adjacent floating electrodes is formed greater at the side away from the substrate than at the substrate side.

2. The nonvolatile semiconductor memory device according to claim 1, wherein the concave portion, into which the second insulating film is formed, extends to the element isolation portions.

3. The nonvolatile semiconductor memory device according to claim 2, wherein an area of a face, which is perpendicular to the depth direction, of the concave portion is made narrower from the opening portion to the bottom portion.

4. The nonvolatile semiconductor memory device according to claim 1, wherein the concave portion is a V-shape.

5. The nonvolatile semiconductor memory device according to claim 1, wherein the sum of thickness of respective step portions other than a thickness of a step portion at the most substrate side among the step portions of the floating electrode is $\frac{1}{3}$ or more with respect to the sum of the thickness of all of the step portions.

6. The nonvolatile semiconductor memory device according to claim 1, wherein the sum of the outer circumferential length, at the second insulating layer side, of the cross-section of the floating electrode is greater than or equal to 90% with respect to the sum of the cross-section, in the thickness direction and in the transverse direction, of the floating electrode.

7. The nonvolatile semiconductor memory device according to claim 1, wherein an area of a face, which is perpendicular to the depth direction, of the concave portion is made narrower from the opening portion to the bottom portion.

8. The nonvolatile semiconductor memory device according to claim 1, wherein the element isolation portions project from the substrate.

* * * * *